March 5, 1968 J. E. KREPPS 3,372,340

TRIODE AUTODYNE CIRCUIT

Filed Sept. 24, 1964

2 Sheets-Sheet 1

INVENTOR

JAMES E. KREPPS by Mason, Kolehmainen, Rathburn and Wyss

ATTORNEYS.

INVENTOR
JAMES E. KREPPS
by
Mason, Kolehmainen, Rathburn and Wyss
ATTORNEYS.

United States Patent Office 3,372,340

Patented Mar. 5, 1968

3,372,340
TRIODE AUTODYNE CIRCUIT

James Edgar Krepps, Bloomington, Ind., assignor to Sarkes Tarzian, Inc., Bloomington, Ind., a corporation of Indiana Filed Sept. 24, 1964, Ser. No. 398,951
6 Claims. (Cl. 325—440)

The present invention relates to mixer-oscillator circuits suitable for use in tuners and receivers and, more particularly, to the so-called autodyne type of mixer-oscillator circuit wherein a single tube is employed to perform the function of generating a local oscillator signal and mixing the generated local oscillator signal with an incoming RF signal to develop an intermediate frequency output signal.

Various types of autodyne mixer-oscillator circuits have been proposed in the past, and certain of these autodyne circuits have employed a triode tube as the sole oscillation and mixing element of the circuit. However, the low plate impedance of the triode tube is difficult to match to either a high Q oscillator tank circuit or a high selectivity intermediate frequency output circuit. If the triode plate resistance is not properly matched to the oscillator tank circuit sufficient strength of oscillations, particularly at the high frequencies, is not achieved. On the other hand, the triode plate resistance should preferably be matched to the intermediate frequency output circuit in such manner that good selectivity and noise rejection in this circuit are achieved. It is also extremely desirable to provide an autodyne circuit in which tuning of the local oscillator tank circuit, for alignment purposes or the like, does not interact with or affect the tuning of the preceding RF stage.

Furthermore, the RF input signal should be applied to a point in the autodyne circuit which has substantially zero oscillator voltage. Otherwise, a local oscillator signal will be reflected back into the RF stage and cause undesired local oscillator radiation through the antenna system connected to the input of this stage.

In addition, it is necessary to neutralize the autodyne circuit at the frequency of the intermediate frequency output signal in order to prevent oscillation of the autodyne circuit at this frequency which is substantially lower than the local oscillator and RF frequencies being handled by the autodyne. It is also desirable that the neutralization be independent of the other circuit parameters which must be adjusted for optimum matching to the local oscillator tank circuit and the intermediate frequency output circuit.

It is, therefore, an object of the present invention to provide a new and improved triode autodyne circuit which eliminates one or more of the above discussed disadvantages of prior art arrangements.

It is another object of the present invention to provide a new and improved triode autodyne circuit wherein improved matching to both a high Q oscillator tank circuit and a high impedance intermediate frequency output circuit is achieved in a simple and economical manner.

It is a still further object of the present invention to provide a new and improved triode autodyne circuit wherein neutralization of the triode at the intermediate frequency is achieved by means which is substantially independent of the circuit parameters employed to match the low plate resistance of the triode to the oscillator tank circuit and the intermediate frequency output circuit.

It is a further object of the present invention to provide a new and improved triode autodyne circuit wherein adjustment and alignment of the oscillator tank circuit may be made without interaction upon the tuning of the preceding RF stage.

It is another object of the present invention to provide a new and improved triode autodyne circuit which is simple and economical in construction and provides a relatively stable local oscillator signal despite wide variations in temperature.

The invention, both as to its organization and method of operation, together with further objects and advantages thereof, will best be understood by reference to the following description, taken in conjunction with the accompanying drawings, in which.

Figures 1, 3:
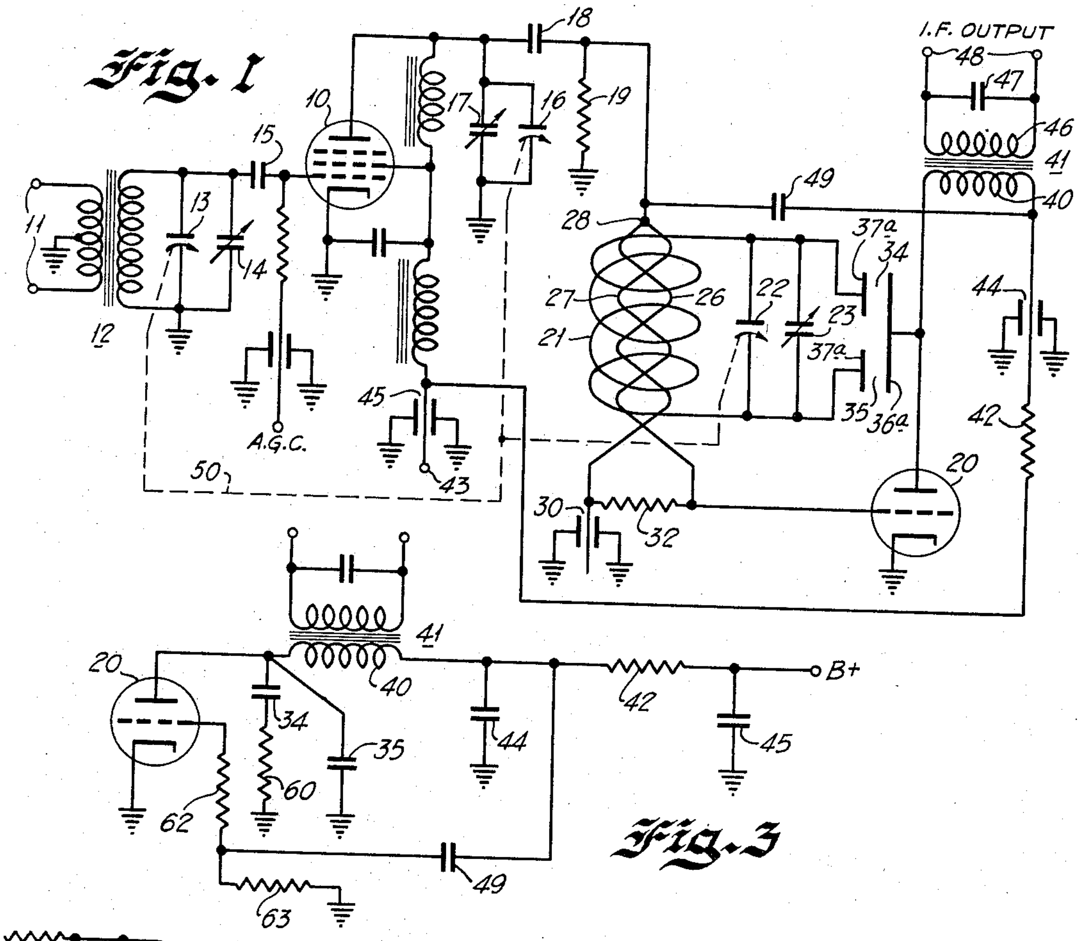
FIG. 1 is a schematic diagram of a portion of a modulated signal wave receiver embodying the principles of the present invention.
FIG. 3 is a fragmentary schematic diagram illustrating the operation of the autodyne portion of FIG. 1 in developing an intermediate frequency output signal.
Figure 2:
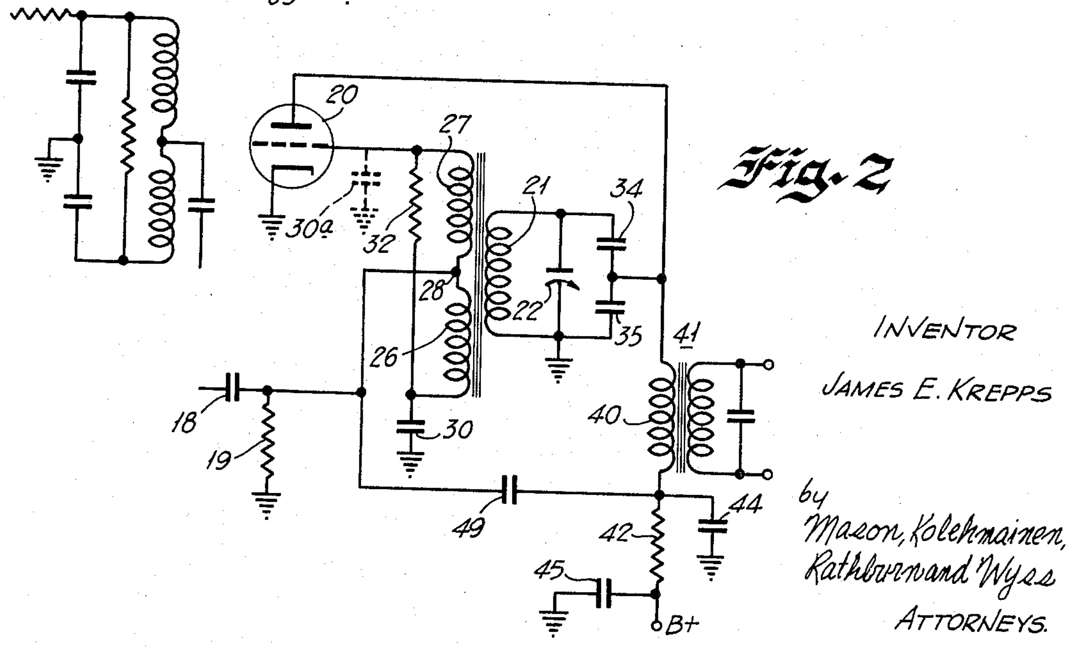
FIG. 2 is a fragmentary circuit diagram illustrating the operation of the autodyne portion of FIG. 1 as a mixer-oscillator.
Figure 4:
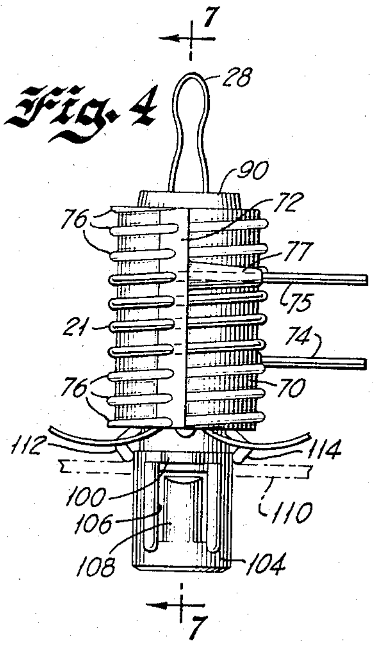
FIG. 4 is a front elevational view of the autodyne oscillator tuning coil arrangement of the circuit of FIG. 1.
Figure 5:
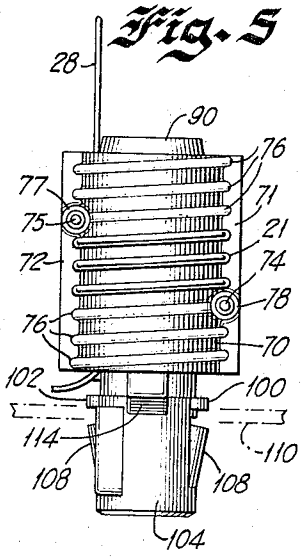
FIG. 5 is a right side elevational view of the coil arrangement of FIG. 4.
Figure 6:
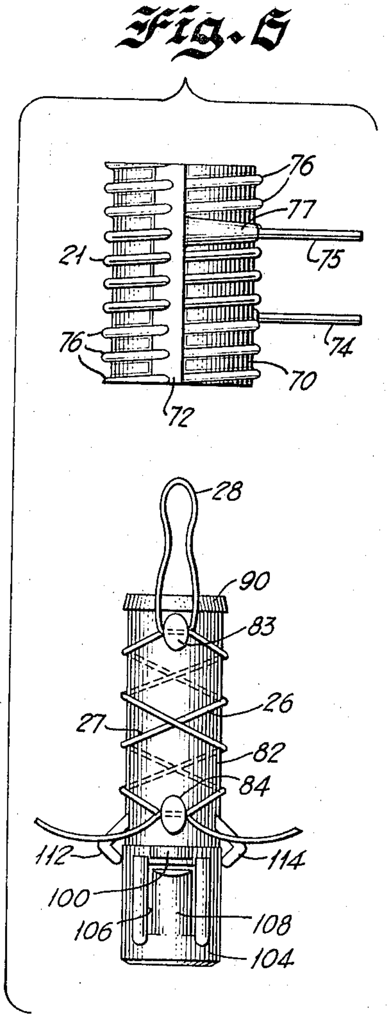
FIG. 6 is an exploded view of the coil arrangement of FIG. 4.
Figure 7:
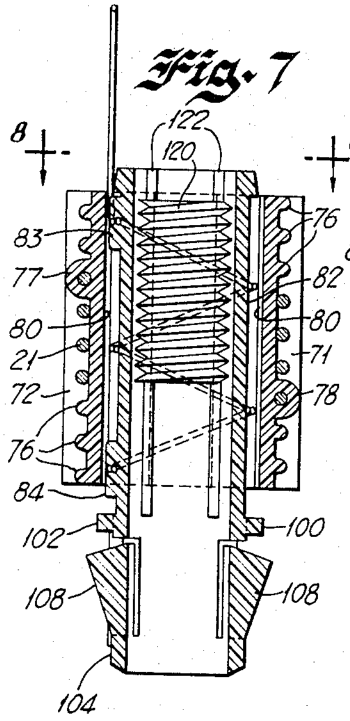
FIG. 7 is a sectional view taken along the line 7—7 of FIG. 4.
Figure 8:
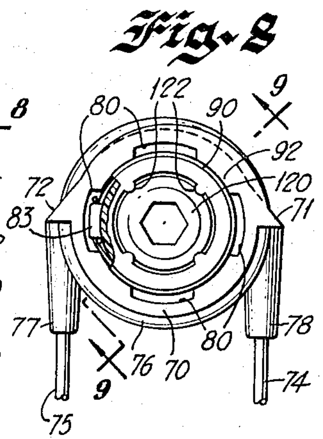
FIG. 8 is a top sectional view taken along the line 8—8 of FIG. 7.
Figure 9:
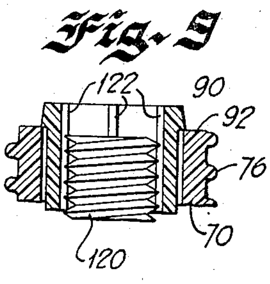
FIG. 9 is a sectional view taken along the line 9—9 of FIG. 8.

Referring now to the drawings and more particularly to FIGS. 1, 2 and 3 thereof, the triode autodyne circuit of the present invention is therein illustrated in conjunction with an RF stage, indicated generally at 10, of the pentode type. Signals received on a suitable antenna system are applied to the input terminals 11 of an antenna input transformer 12, a secondary of which is tuned by means of a variable capacitor 13 and may be aligned by a suitable trimmer capacitor 14. The selected input signal is coupled through a capacitor 15 to the grid of the RF stage 10 and is amplified therein to appear in the plate circuit of the stage 10 as an amplified selected RF signal. The plate circuit of the stage 10 is tuned by a variable capacitor 16 and may be aligned by a suitable trimmer capacitor 17. Signals developed across the plate tuning capacitor 16 are coupled through a capacitor 18 to the RF input point of the triode autodyne circuit and this capacitor is connected to ground through a resistor 19.

The autodyne circuit of FIG. 1 comprises a triode tube indicated generally at 20 and a local oscillator tank coil 21 is tuned by means of a variable capacitor 22 to provide the desired local oscillator frequency which is offset from the incoming RF signal by an amount such as to provide the desired intermediate frequency output signal. The oscillator tank circuit 21, 22 may be adjusted at the high end of the received band of frequencies by means of a trimmer capacitor 23. Positioned within the local oscillator tank coil 21, by means to be described in more detail hereinafter, is a pair of cross-wound or shoelace type secondary windings 26, 27. The upper ends of the windings 26 and 27 are connected together at the junction indicated at 28, and this junction point is connected to the coupling capacitor 18 from the preceding RF stage. The bottom end of the winding 27 is connected to the grid of the triode autodyne tube 20 and the bottom end of the winding 26 is connected through a capacitor 30 to ground, the cathode of the triode autodyne tube 20 being also connected to ground. It will be understood that the capacitor 30 is of the so-called feed through type but in this instance the feed through connection of this capacitor is not employed to establish a connection to an external circuit, the capacitor 30 acting merely as a small shunt capacitor to ground from the bottom end of the winding 26. A damping resistor 32 is connected across the bottom ends of the windings 26, 27.

The plate of the triode autodyne tube 20 is connected through a first capacitor 34 to the upper end of the oscillator tank coil 21 and through a capacitor 35 to ground. While the capacitors 34, 35 may be independent capacitors, they are preferably of the so-called dual disk type having a common plate 36A and a pair of independent plates 37A and 37B so that both capacitors are formed by a single physical structure.

The plate of the triode autodyne tube 20 is also connected through the primary winding 40 of an IF output transformer indicated generally at 41 and through a plate load resistor 42 to a source of B plus potential connected to the terminal 43. A first feed through capacitor 44 is connected between the junction of the primary winding 40 and the resistor 42 to ground, for reasons to be described in more detail hereinafter, and a second feed through capacitor 45, which operates as a bypass capacitor, is connected from the B plus terminal 43 to ground. The secondary winding 46 of the IF output transformer 41 is tuned by a suitable capacitor 47 and the intermediate frequency output signal developed at the output terminals 48 is coupled to the next succeeding IF stage and the receiver. A neutralizing capacitor 49 is connected from the junction point of the primary winding 40 and the capacitor 44 to the common connection point 28 of the balanced secondary windings 26, 27. Preferably the variable capacitors 13, 16 and 22 are all tuned in unison by means of a common mechanical coupling indicated by the dotted line 50 in FIG. 1, as will be readily understood by those skilled in the art.

Considering now the operation of the above-described triode autodyne circuit in conjunction with the preceding RF stage 10, it will be understood that the input circuit including the capacitor 13 will be adjusted to select a particular incoming RF signal which is amplified in the stage 10 and appears across the capacitor 16 in amplified form, this capacitor also being tuned to the desired RF input signal. In considering the operation of the autodyne circuit which includes the triode tube 20, reference will be had to FIG. 2 of the drawings which shows the circuit constants in simplified form to facilitate an understanding of the operation of this phase of the autodyne circuit.

Thus, referring to FIG. 2, the oscillator tank circuit comprising the winding 21 and tuning capacitor 22, is inductively coupled back to the grid of the triode tube 20 through the secondary winding 26, the polarity of this winding being so chosen as to develop sustained oscillations in the tank circuit. The plate of the triode tube 20 is connected to the junction of the capacitors 34, 35 and these capacitors are connected in series across the oscillator tank circuit 21, 22. Accordingly, the plate resistance of the triode tube 20 is connected to the oscillator tank circuit at a tapped point such that the low plate resistance of the triode tube 20 is effectively matched to the relatively high impedance of the oscillator tank circuit. The plate and grid circuits of the triode tube 20 are thus coupled together in such manner as to provide sustained oscillations in the tank circuit 21, 22 at the desired local oscillator frequency.

It is also pointed out that with this arrangement the low plate resistance of the tube 20 is connected across only a portion of the tank circuit 21, 22, i.e., across the capacitor 35 so that effective impedance matching of the low impedance plate circuit of the triode 20 to the relatively high impedance of the local oscillator tank circuit is achieved. This means that good oscillator strength even at the high frequencies is provided, since the oscillator tank circuit is not as heavily loaded as it would be if the plate resistance of the tube 20 were connected directly across the entire tank circuit.

In accordance with a further important feature of the invention, the RF input signal for the preceding RF stage 10 is applied to the autodyne circuit at a point of substantially zero local oscillator voltage. More particularly, the bottom end of the secondary winding 27 is connected to ground through the capacitor 30 and this capacitor has a value substantially equal to the grid to cathode capacitance of the triode tube 20, this capacitance being indicated in dotted lines as the capacitor 30*a* in FIG. 2. Furthermore, the windings 26, 27 are wound to be exactly balanced so that the junction point 28 of the windings 26, 27 has substantially no local oscillator signal present thereat, even though the winding 26 is employed to couple a feedback local oscillator signal to the grid of the tube 20. The RF signal is then coupled through the capacitor 18 to the junction point 28 so that the RF signal is applied through the secondary windings 26, 27 to the grid of the tube 20 so that the RF signal may be mixed with the local oscillator signal and the desired intermediate frequency signal will appear in the plate circuit of the tube 20. For oscillator-mixer operation, the primary winding 40 of the IF transformer 41 acts as a choke plate impedance for the plate of the autodyne tube 20 so as to permit a suitable local oscillator voltage to be developed and applied to the tank circuit 21, 22. However, the capacitor 44 is effective to bypass the RF and oscillator signal components to ground so that the IF neutralizing capacitor 49, which is of relatively low capacitance value, does not interfere with the operation of the circuit as a mixer-oscillator. Furthermore, the neutralizing capacitor 49 is connected to the junction point 28 at which zero oscillator voltage exists so that this capacitor cannot affect the operation of the local oscillator portion of the autodyne circuit.

Considering now the operation of the autodyne circuit of FIG. 1 in developing the desired intermediate frequency output signal, this circuit has been redrawn in FIG. 3 to facilitate an understanding of the action of the various circuit parameters in producing the desired intermediate frequency output signal. Thus, referring to FIG. 3, the oscillator tank circuit comprising the coil 21 and capacitor 22 will have a very low impedance at the frequency of the intermediate frequency output signal, this impedance being indicated in FIG. 3 as the impedance 60 connected in series from the capacitor 34 to ground. At the intermediate frequency, the capacitors 34 and 35 are thus connected essentially in parallel. It will thus be seen that the capacitors 34, 35, the primary winding 40 of the IF output transformer 41, and the capacitor 44 form a pi network. More particularly, the capacitors 34, 35 form the first shunt leg of this pi network, the primary winding 40 forms the series leg of the pi network and the capacitor 44 forms the second shunt leg of this network. With this arrangement, the low plate resistance of the triode tube 20 is effectively matched to the relatively high impedance of the primary winding 40 of the IF transformer 41 since this plate resistance is connected across only the input leg comprising the capacitors 34, 35 of the pi network. Accordingly, the output transformer 41 may have good selectivity and high Q without deleterious loading effects of the low resistance triode tube 20. In addition, the intermediate frequency voltage developed across the capacitor 44 is employed as a source of feedback voltage for neutralizing the triode 20 at the intermediate frequency. Thus, the voltage developed across the capacitor 44 is coupled through the neutralizing capacitor 49 to the grid of the triode tube 20, the secondary windings 26, 27 and the resistor 32 being indicated in FIG. 3 as the series impedance 62 and the shunt impedances to ground of the associated circuit components being indicated as the impedance 63.

The above-described autodyne circuit of the present invention affords a number of advantages in circuit design without interaction between the various circuit components. Thus, the plate resistance of the triode tube 20 may be matched to the oscillator tank circuit by appropriate choice of the values of the capacitors 34, 35, since these capacitors control the effective tapping point of the plate resistance of the tube 20 into the oscillator tank circuit 21, 22. While the ratios of the capacitors 34 and 35 may be varied to appropriately match the tube 20 to the oscillator tank circuit, the total capacitance of these two capacitors is made equal to the capacitor 44 which forms the other leg of the pi network shown in FIG. 3. Accordingly, an appropriate impedance match of the tube 20 to the IF output transformer 41 may also be obtained without affecting the matching relationship of the tube 20 to the oscillator tank circuit 21, 22. In addition, the neutralizing capacitor 49 may be chosen to have the desired value for neutralizing the triode 20 at the desired intermediate frequency without affecting either of the above-described matching functions. As a result, all of the matching and neutralizing functions may be independently optimizable with any particular triode plate resistance.

It will also be noted that the tuning and alignment of the oscillator tank circuit 21, 22 does not reflect back upon or interact with the tuning of the plate circuit of the RF stage 10 which includes the variable capacitor 16. This is because the RF signal is connected at the junction point 28 of the two secondary windings 26, 27 and these two windings are exactly balanced insofar as the oscillator voltage is concerned due to the matching of the capacitor 30 connected to the bottom end of the winding 26 with the grid to cathode capacitance 30*a* of the triode 20. Furthermore, since the RF signal is connected at the junction point 28 at which no oscillator signal exists, no oscillator voltage is coupled back to the RF stage 10 so that re-radiation at the oscillator signal frequency is avoided.

The resistor 32 functions to provide a relatively substantial damping effect upon the balanced secondary windings 26, 27 so that these windings are not self-resonant. Furthermore, this damping resistor has the function of providing very constant oscillator strength even at the high frequency end of the tuning range.

In order to provide the above-described oscillator tank coil and balanced feedback winding arrangement, and for the purpose of providing an oscillator tuning circuit which is relatively insensitve to temperature variations, the oscillator tank coil and feedback windings preferably have the physical arrangement shown in FIGS. 4 to 9, inclusive. Referring to these figures, there is provided an outer tubular coil form 70 on the outer periphery of which the oscillator tank coil 21 is formed. The coil form 70 is preferably formed of polyurethane, lexan or some other suitable plastic material having good dielectric versus temperature characteristics. The coil form 70 is provided with vertically extending rib portions 71 and 72 which are molded around the individual turns of the oscillator coil 21 so that the turns of this coil are rigidly fixed and maintained. Preferably, the coil 21 is first wound about a suitable mandril and is then placed in a mold with the leads 74 and 75 thereof extending through suitable apertures in the mold. The plastic material is then inserted into the mold to provide the coil form 70. Since the moding die has grooves corresponding to various lengths of oscillator coil, a number of additional ridges of plastic 76 will be formed in the areas where the turns of the coil 21 are not present. Also, the ribs 71, 72 may be formed at the parting edges of the two sections of the mold, and rigid end connections of plastic 77, 78 are provided around the exit holes for the leads 74, 75.

The tubular coil form 70 is provided with a series of vertically extending internal grooves 80 in the interior wall thereof to provide an indexing arrangement for a separate inner coil form 82 which is also of hollow tubular construction. The coil form 82 is also of polyurethane or other suitable plastic material and is provided with a pair of stud portions 83, 84 adjacent the top and bottom portions thereof. The balanced secondary windings 26 and 27 are secured to one of the posts 83, 84 and are then wound in shoelace fashion around the coil form 82 and are secured at the other end thereof to the other one of the posts 83, 84. Preferably, these posts 83, 84 are heat sealable so as to provide a positive physical connection for the ends of the windings 26, 27 so that these windings are accurately held in spaced position along the coil form 82. The upper ends of the windings 26, 27 are connected together to provide the junction point 28 shown in FIG. 1 and the bottom ends of the windings 26, 27 are connected into the circuit as shown in FIG. 1. Preferably, these end portions of the windings 26, 27 are of the same length to provide a completely balanced circuit for injection of the RF signal, as described in detail heretofore.

The studs 83, 84 on the coil form 82 are arranged to be inserted into one of the grooves 80 of the outer coil form 70 and the relative positions of the coil 21 and the coils 26, 27 may be adjusted by choosing a particular one of the grooves 80. The coil form 82 is provided with an enlarged end portion 90 which may be forced through the inside of the coil form 70 and snaps in place over the upper end 92 of the coil form 70, as specifically shown in FIG. 9. With this arrangement, the coil forms 70 and 82 may be separately formed and prepared and then combined in the manner shown to provide the completed oscillator tuning coil unit. In this connection it will be understood that the upper ends of the wires forming the junction 28 may extend alongside the stud 83 so that they have clearance to project above the upper end of the coil form 70 when the inner coil form 82 is inserted therein.

In order to mount the oscillator tuning coil unit, including the outer coil form 70 and inner coil form 82, the coil form 82 is provided with a snap-lock arrangement for mounting the same in a suitable base member such as a conventional chassis. More particularly, the coil form 82 is provided with a pair of shoulders 100, 102 on opposite sides thereof adjacent the stud 84. The end portion 104 of the coil form 82 is provided with opposed openings 106 which define outwardly extending deformable shoulders 108 which are adapted to engage the underside of a chassis 110 with the shoulders 100, 102 resting on the upper surface of the chassis 110 when the coil form 82 is snapped into place from the top of the chassis. A pair of right-angle flexible arm portions 112, 114 are also formed integrally with the coil form 82 and are normally arranged to extend downwardly below the shoulders 100, 102. However, when the coil form 82 is inserted in the chassis 110, these arm portions 112, 114 are deformed to the position shown in FIG. 4 and exert tension on the form 82 to hold it in place.

In order to tune the oscillator tuning coil 21 to the desired oscillator frequency, a tuning slug 120 is positioned within the tubular coil form 82. To this end the coil form 82 is provided with a plurality of vertically extending internal ribs 122 which are adapted to be engaged by the threads of the tuning slug 120 as it is inserted into the coil form 82. The ribs 122 are preferably sufficiently deformable so that the threaded edge of the tuning slug 120 forms mating threads in the ribs 122 and thereby holds the slug 120 in its adjusted position. Adjustment of the slug 120 with respect to the oscillator coil 21 will thereby provide a variation of the inductance of this coil, as will be readily understood by those skilled in the art. The slug 120 is positioned inside the inner coil form 82 and hence is positioned a considerable distance from the oscillator coil 21 so that the slug 120 has to have a substantial length to provide the desired variation of oscillator inductance. However, the feature of providing the balanced feedback windings 26, 27 inside of the oscillator tank coil 21 has the advantage that the inductive coupling between the winding 21 and the windings 26, 27 is very good and provides sufficient inductive coupling even at the high frequencies. This feature further facilitates the attainment of uniform oscillator strength over the entire tuning range of the autodyne circuit. Adjustment of the slug 120 is used as a padding adjustment at the lower end of the tuning band and the trimmer 23 is used for an alignment adjustment at the high end of the tuning band.

In the oscillator tuning unit described heretofore the feedback windings 26, 27 are positioned a substantial distance away from the oscillator tuning coil 21 which is formed on the outer surface of the coil form 70. Accordingly, the distributed capacitance between the windings 26, 27 and the oscillator coil 21 which forms a part of the oscillator tank circuit is quite small. Furthermore, since the material of the coil form 70 occupies a substantial portion of the space between the feedback windings 26, 27 and the coil 21 and the material of the coil form 70 has a good dielectric versus temperature characteristic, this distributed capacitance will vary only a slight amount for large variations in temperature. Since the distributed capacitance is effectively added to the oscillator tank circuit to determine its frequency of oscillation, this means that the oscillator frequency is quite stable under extreme temperature variations since the distributed capacitance to the feedback windings 26, 27 is small and does not vary appreciably with temperature.

While a particular embodiment of the invention has been shown, it will be understood, of course, that it is not desired that the invention be limited thereto since modifications may be made, and it is, therefore, contemplated by the appended claims to cover any such modifications as fall within the true spirit and scope of the invention.

Having thus described the invention, what is claimed and desired to be secured by Letters Patent of the United States is:

1. An autodyne circuit comprising, a triode tube, an oscillator tank circuit, means including first and second capacitors connected across said tank circuit for coupling the same to the plate of said triode, said capacitors being connected in series across said tank circuit and said plate being connected to the junction of said first and second capacitors, means including a pair of balanced windings inductively coupled to said tank circuit for feeding a signal from said tank circuit to the grid of said triode in the proper phase to sustain oscillations therein, a source of signal input voltage, means connecting said source to said balanced windings at a point of substantially zero oscillator voltage, an intermediate frequency output impedance, a third capacitor, means connecting said output impedance and said third capacitor in series between the plate of said triode and ground, said first, second and third capacitors and said output impedance forming a pi network at the intermediate frequency, said first and second capacitors collectively forming one shunt leg of said pi network, said third capacitor forming the other shunt leg of said pi network and said output impedance forming the series leg of said network, and a neutralizing capacitor connected from the junction of said output impedance and said third capacitor to said point of zero oscillator voltage.

2. An autodyne circuit comprising, a triode tube, a first coil form having an oscillator tank coil thereon, means including said tank coil for providing an oscillator tank circuit, first and second capacitors connected across said tank circuit, means connecting the plate of said tube to the junction of said first and second capacitors, a second coil form having a pair of balanced cross-wound secondary windings thereon, one end of each of said secondary windings being connected together, means connecting the other end of one of said secondary windings to the grid of said tube, thereby to provide a feedback path from said tank circuit to said grid to produce sustained oscillations in said tank circuit, said second coil form being positioned inside said first coil form to provide increased feedback coupling at the higher frequencies, means connecting an input signal to one ends of said secondary windings, an intermediate frequency output impedance, a third capacitor, means connecting said output impedance and said third capacitor in series between the plate of said triode and ground, said first, second and third capacitors and said output impedance forming a pi network at the intermediate frequency in which said first and second capacitors collectively form one shunt leg of said pi network, said third capacitor forms the other shunt leg of said pi network and said output impedance forms the series leg of said network, and a neutralizing capacitor connected from the junction of said output impedance and said third capacitor to said one ends of said secondary windings.

3. An autodyne circuit comprising, a triode tube, an oscillator tank coil, means including said tank coil for providing an oscillator tank circuit, first and second capacitors connected across said tank circuit, means connecting the plate of said tube to the junction of said first and second capacitors, a pair of balanced cross-wound secondary windings inductively coupled to said tank coil, one end of each of said secondary windings being connected together, means connecting the other end of one of said secondary windings to the grid of said tube, thereby to provide a feedback path from said tank circuit to said grid to produce sustained oscillations in said tank circuit, means connecting an input signal to said one ends of said secondary windings, an intermediate frequency output impedance, a third capacitor, means connecting said output impedance and said third capacitor in series between the plate of said triode and ground, said first, second and third capacitors and said output impedance forming a pi network at the intermediate frequency in which said first and second capacitors collectively form one shunt leg of said pi network, said third capacitor forms the other shunt leg of said pi network and said output impedance forms the series leg of said network, and a neutralizing capacitor connected from the junction of said output impedance and said third capacitor to said one ends of said secondary windings.

4. An autodyne circuit comprising, a triode tube, a first coil form having an oscillator tank coil thereon, means including said tank coil for providing an oscillator tank circuit, first and second capacitors connected across said tank circuit, means connecting the plate of said tube to the junction of said first and second capacitors, a second coil form having a pair of balanced cross-wound secondary windings thereon, one end of each of said secondary windings being connected together, means connecting the other end of one of said secondary windings to the grid of said tube, thereby to provide a feedback path from said tank circuit to said grid to produce sustained oscillations in said tank circuit, a balancing capacitor, means connecting said balancing capacitor between the other end of the other of said windings and the cathode of said triode tube, said balancing capacitor having substantially the same value of capacitance as the grid to cathode capacitance of said tube whereby substantially no oscillations are produced at the junction of said one ends of said windings, said second coil form being positioned inside said first coil form to provide increased feedback coupling at the higher frequencies, means connecting an input signal to said one ends of said secondary windings, an intermediate frequency output impedance, a third capacitor, means connecting said output impedance and said third capacitor in series between the plate of said triode and ground, said first, second and third capacitors and said output impedance forming a pi network at the intermediate frequency in which said first and second capacitors collectively form one shunt leg of said pi network, said third capacitor forms the other shunt leg of said pi network and said output impedance forms the series leg of said network, and a neutralizing capacitor connected from the junction of said output impedance and said third capacitor to said point of zero oscillator voltage.

5. An autodyne circuit comprising, a triode tube, an oscillator tank coil, means including said tank coil for providing an oscillator tank circuit, first and second capacitors connected across said tank circuit, means connecting the plate of said tube to the junction of said first and second capacitors, a pair of balanced cross-wound secondary windings inductively coupled to said tank coil, one end of each of said secondary windings being connected together, means connecting the other end of one of said secondary windings to the grid of said tube, thereby to provide a feedback path from said tank circuit to said grid to produce sustained oscillations in said tank circuit, a balancing capacitor, means connecting said balancing capacitor between the other end of the other of said windings and the cathode of said triode tube, said balancing capacitor having substantially the same value of capacitance as the grid to cathode capacitance of said tube whereby substantially no oscillations are produced at the junction of said one ends of said windings, means connecting an input signal to said one ends of said secondary windings, an intermediate frequency output impedance, a third capacitor, means connecting said output impedance and said third capacitor in series between the plate of said triode and ground, said first, second and third capacitors and said output impedance forming a pi network at the intermediate frequency in which said first and second capacitors collectively form one shunt leg of said pi network, said third capacitor forms the other shunt leg of said pi network and said output impedance forms the series leg of said network, and a neutralizing capacitor connected from the junction of said output impedance and said third capacitor to said point of zero oscillator voltage.

6. An autodyne circuit comprising, a triode tube, a first coil form having an oscillator tank coil thereon, means including said tank coil for providing an oscillator tank circuit, first and second capacitors connected across said tank circuit, means connecting the plate of said tube to the junction of said first and second capacitors, said first and second capacitors having a ratio such as to match the plate resistance of said triode tube to said tank circuit, a second coil form having a pair of balanced cross-wound secondary windings thereon, one end of each of said secondary windings being connected together, means connecting the other end of one of said secondary windings to the grid of said tube, thereby to provide a feedback path from said tank circuit to said grid to produce sustained oscillation in said tank circuit, a balancing capacitor, means connecting said balancing capacitor between the other end of the other of said windings and the cathode of said triode tube, said balancing capacitor having substantially the same value of capacitance as the grid to cathode capacitance of said tube whereby substantially no oscillations are produced at the junction of said one ends of said windings, said second coil form being positioned inside said first coil form to provide increased feedback coupling at the higher frequencies, means connecting an input signal to said one ends of said secondary windings, an intermediate frequency output impedance, a third capacitor, means connecting said output impedance and said third capacitor in series between the plate of said triode and ground, said first, second and third capacitors and said output impedance forming a pi network at the intermediate frequency in which said first and second capacitors collectively form one shunt leg of said pi network, said third capacitor forms the other shunt leg of said pi network and said output impedance forms the series leg of said network, said pi network matching the plate resistance of said triode tube to said output impedance, and a neutralizing capacitor connected from the junction of said output impedance and said third capacitor to said point of zero oscillator voltage.

No references cited.

KATHLEEN H. CLAFFY, *Primary Examiner.*

R. S. BELL, *Assistant Examiner.*